United States Patent
Nguyen et al.

[11] Patent Number: 5,936,707
[45] Date of Patent: Aug. 10, 1999

[54] MULTI-LEVEL RETICLE SYSTEM AND METHOD FOR FORMING MULTI-LEVEL RESIST PROFILES

[75] Inventors: Tue Nguyen, Vancouver, Wash.; Bruce Dale Ulrich; David Russell Evans, both of Beaverton, Oreg.

[73] Assignees: Sharp Laboratories of America, Inc., Camas, Wash.; Sharp Kabushiki Kaisha, Osaka, Japan

[21] Appl. No.: 09/008,362

[22] Filed: Jan. 16, 1998

Related U.S. Application Data

[62] Division of application No. 08/660,870, Jun. 10, 1996.

[51] Int. Cl.$^6$ .......................... G03B 27/00; G03B 27/28; G03B 27/04
[52] U.S. Cl. ............................. 355/18; 355/125; 355/122
[58] Field of Search ........................... 355/18, 53; 430/5, 430/314, 322, 323, 311; 216/12

[56] References Cited

U.S. PATENT DOCUMENTS

| | | | |
|---|---|---|---|
| 5,143,820 | 9/1992 | Kotecha et al. | 430/314 |
| 5,213,916 | 5/1993 | Cronin et al. | 430/5 |
| 5,225,035 | 7/1993 | Rolfson | 156/643 |
| 5,237,393 | 8/1993 | Tominaga | 356/401 |
| 5,308,721 | 5/1994 | Garofalo et al. | 430/5 |
| 5,328,786 | 7/1994 | Miyazaki et al. | 430/5 |
| 5,328,807 | 7/1994 | Tanaka et al. | 430/311 |

(List continued on next page.)

FOREIGN PATENT DOCUMENTS 0583942  2/1994  European Pat. Off. ............... 430/5 X

OTHER PUBLICATIONS

Article entitled, "Fabrication of 64M Dram with i–Line Phase–Shift Lithography" by K. Nakagaw, M. Taguchi and T. Ema printed in the IEDM 90–817, 1990 IEEE, pp. 33.1.1–33.1.4.

Article entitled, "Transparent Phase Shifting Mask", by H. Watanabe, Y. Todokoro, and M. Inoue, printed in the IEMM 90–821, 1990 IEEE, pp. 33.2.1–33.2.4.

Article entitled, "The Control of Sidelobe Intensity with Arrangement of the Chrome Pattern (COSAC) in Half–Tone Phase–Shifting Mask", by S. Kobayashi, N. Oka, K. Watanabe, M. Inoue and K. Sakiyama, reprinted from Extended Abstracts of 1995 Int'l Conference on Solid State Devices and Materials, 8–95, pp. 935–937.

Article entitled, "Improving Resolution in Photolithography with a Phase–Shifting Mask", by M. Levenson, N.S. Viswanathan and R. Simpson, printed in the IEEE Transactions on Electron Devices, vol. ED–29, No. 12, 12–82.

Article entitled, "Phase Masks and Grey–Tone Masks", by Pierre Sixt, Litomask by SCEM, Neuchatel, Switzerland, printed in Semiconductor Fabtech, Issue No. 2, 1995, pp. 209–213.

*Primary Examiner*—Safet Metjahic
*Assistant Examiner*—Peter Kim
*Attorney, Agent, or Firm*—Gerald Maliszewski; David C. Ripma

[57] ABSTRACT

A method is providing for making a multi-level reticle which transmits a plurality of incident light intensities, which in turn, are used to form a plurality of thicknesses in a photoresist profile. A partially transmitting film, used as one of the layers of the reticle, is able to provide an intermediate intensity light. The intermediate intensity light has an intensity approximately midway between the intensity of the unattenuated light passing through the reticle substrate layer, and the totally attenuated light blocked by an opaque layer of the reticle. The exposed photoresist receives light at two intensities to form a via hole in the resist in response to the higher intensity light, and a connecting line to the via at an intermediate level of the photoresist in response to the intermediate light intensity. A method for forming the multi-level resist profile from the multi-level reticle is provided as well as a multi-level reticle apparatus.

21 Claims, 13 Drawing Sheets

U.S. PATENT DOCUMENTS

| | | | |
|---|---|---|---|
| 5,354,632 | 10/1994 | Dao et al. | 430/5 |
| 5,358,827 | 10/1994 | Garofalo et al. | 430/313 |
| 5,384,218 | 1/1995 | Tokui et al. | 430/5 |
| 5,384,219 | 1/1995 | Dao et al. | 430/5 |
| 5,414,746 | 5/1995 | Deguchi et al. | 378/35 |
| 5,426,010 | 6/1995 | Morton | 430/22 |
| 5,427,876 | 6/1995 | Miyazaki et al. | 430/5 |
| 5,446,521 | 8/1995 | Hainsey et al. | 355/53 |
| 5,460,908 | 10/1995 | Reinberg | 430/5 |
| 5,465,859 | 11/1995 | Chapple-Sokol et al. | 216/12 |
| 5,477,058 | 12/1995 | Sato | 250/548 |
| 5,482,799 | 1/1996 | Isao et al. | 430/5 |
| 5,589,303 | 12/1996 | DeMarco et al. | 430/5 |
| 5,725,975 | 3/1998 | Nakamura et al. | 430/5 |

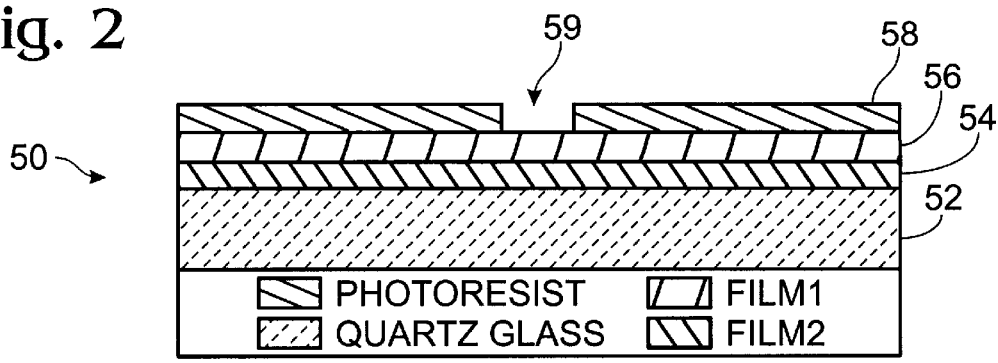
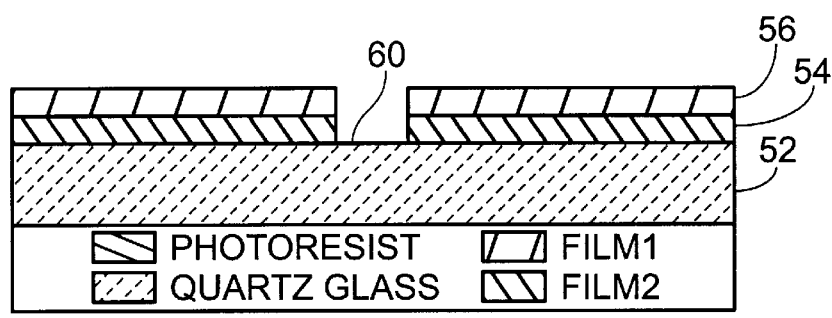
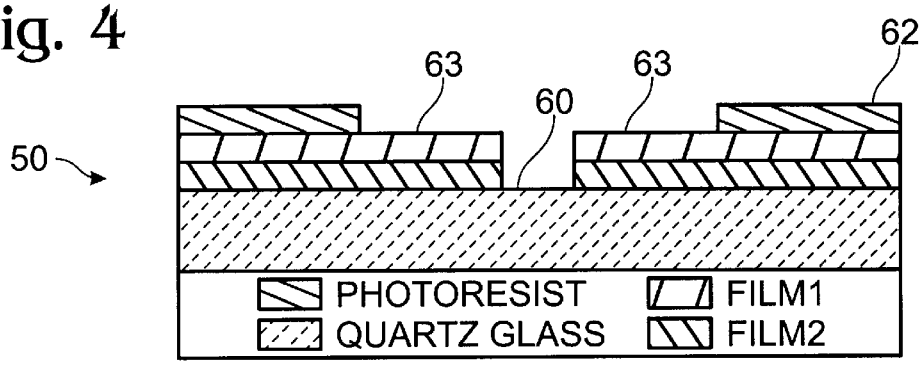
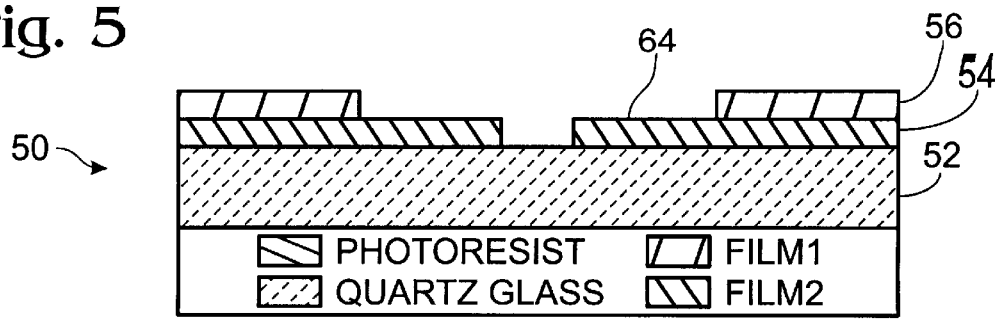

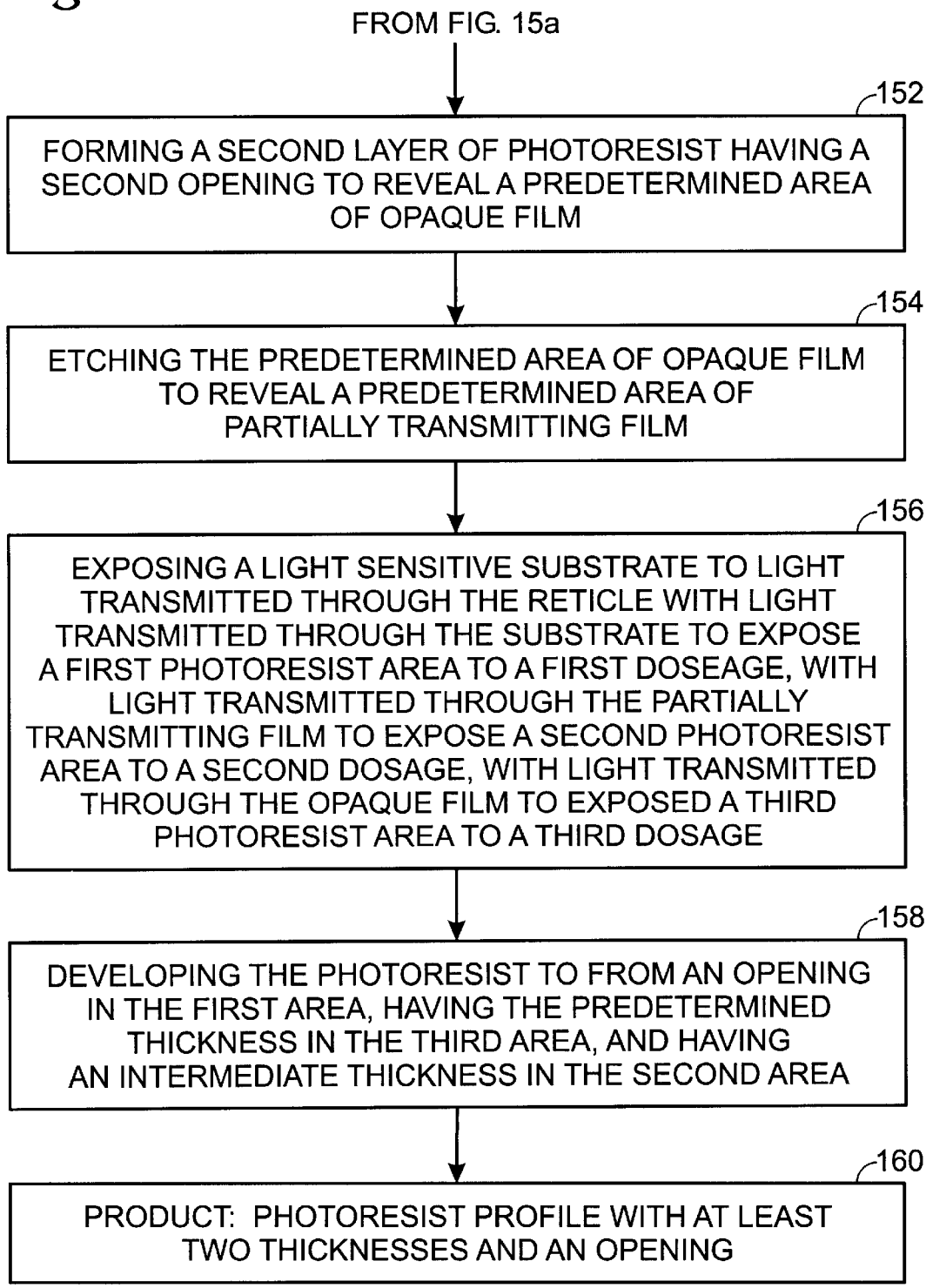

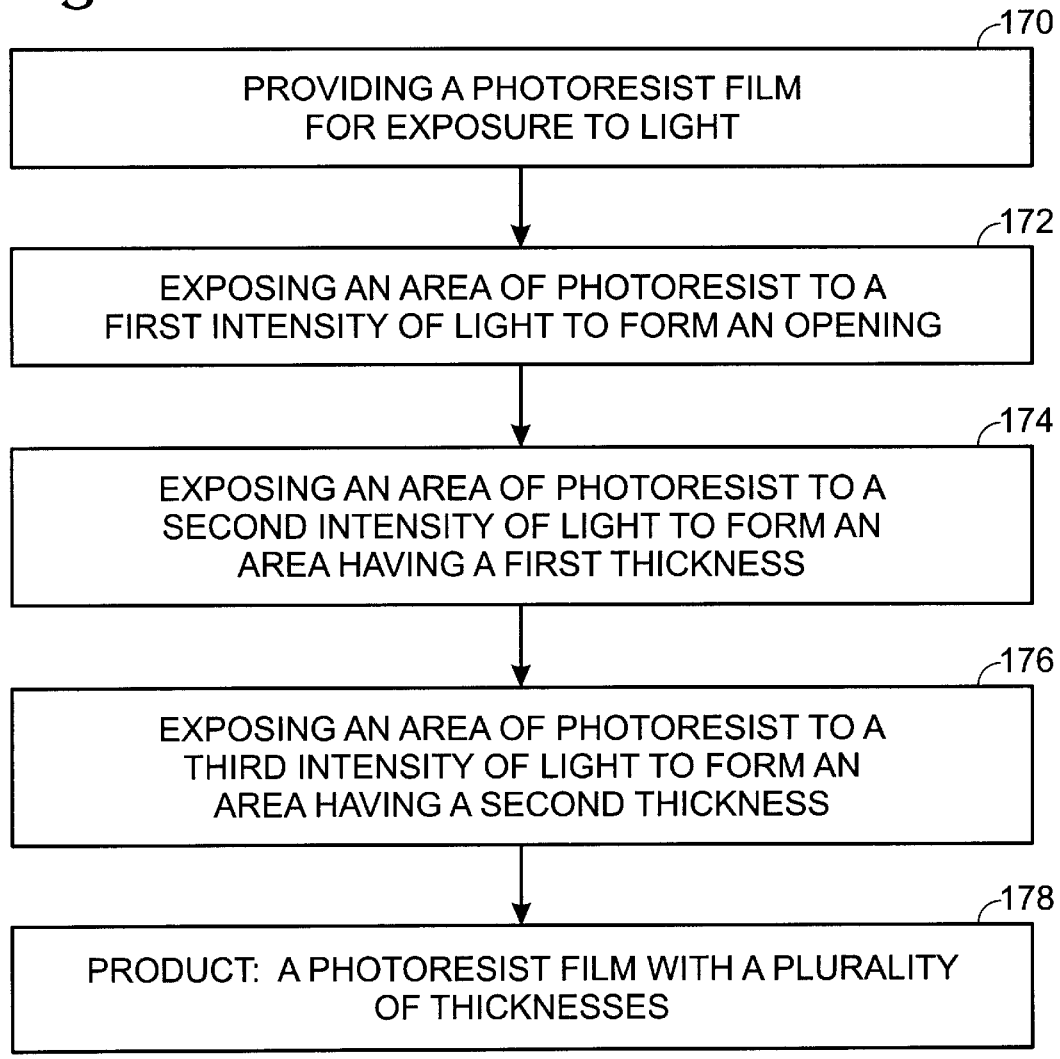

MULTI-LEVEL RETICLE SYSTEM AND METHOD FOR FORMING MULTI-LEVEL RESIST PROFILES

This application is a divisional application of Ser. No. 08/660,870, filed Jun. 10, 1996, entitled MULTI-LEVEL RETICLE SYSTEM AND METHOD FOR FORMING MULTI-LEVEL RESIST PROFILES, and invented by Nguyen et al.

BACKGROUND AND SUMMARY OF THE INVENTION

This invention relates generally to integrated circuit processes and fabrication, and more particularly, to a multi-level reticle and fabrication method for producing multi-level photoresist patterns.

The demand for progressively smaller and more powerful electronic products, in turn, fuels the need for smaller geometry integrated circuits (ICs), and large substrates. It also creates a demand for a denser packaging of circuits onto IC substrates. The desire for smaller geometry IC circuits requires that the interconnections between components and dielectric layers be as small as possible. Therefore, research continues into reducing the width of via interconnects and connecting lines. Copper is a natural choice to replace aluminum in the effort to reduce the size of lines and vias in an electrical circuit. The conductivity of copper is approximately twice that of aluminum and over three times that of tungsten. As a result, the same current can be carried through a copper line having half the width of an aluminum line.

The electromigration characteristics of copper are also much superior to those of aluminum. Copper is approximately ten times better than aluminum with respect to electromigration. As a result, a copper line, even one having a much smaller cross-section than aluminum line, is able to maintain electrical and mechanical integrity.

There have been problems associated with the use of copper, however, in IC processing. Copper pollutes many of the materials used in IC processes and, therefore, care must be taken to keep copper from migrating. In addition, copper is especially prone to oxidation, especially during oxygen etch processes. Care must be take to protect copper from exposure during etch processes, annealing, and processes requiring elevated temperatures. Also, the oxidation products of copper are difficult to clean. In addition, copper cannot be deposited onto substrates using the conventional processes for the deposition of aluminum when the geometries are small. That is, new deposition processes have been developed for use with copper, instead of aluminum, in the lines and interconnects of an IC interlevel dielectric.

It is impractical to sputter metal, either aluminum or copper to fill small diameter vias, the gap filling capability is poor. To deposit copper, a chemical vapor deposition (CVD) technique has been developed in the industry. However, even with the CVD technique, the convention etch process cannot be used. The low volatility of copper etch products require copper to be removed (vaporized) at high temperatures, approximately 250° C., which is too high for photoresist masks. Wet etches are isotropic, and so too imprecise for many applications. Therefore, the IC processing industry has developed a process to form a via using CVD without etching the copper. The new method is called the inlay, or damascene, process.

The damascene method for forming a via or interconnect between a substrate surface and an overlying dielectric surface is described below. The underlying substrate surface is first completely covered with a dielectric, such as oxide. A patterned photoresist profile is then formed over the oxide. The resist profile has an opening, or hole, in the photoresist corresponding to the area in the oxide where the via is to be formed. Other areas of the oxide to be left in place are covered with photoresist. The photoresist covered dielectric is then etched to remove oxide underlying the hole in the photoresist. The photoresist is then stripped away. CVD copper is then used to fill the via. A layer consisting of oxide with a copper via through it now overlies the substrate surface. The excess copper remaining is removed with a chemical mechanical polish (CMP) process, as is well known in the art.

Since the damascene processing method is relatively new to the IC industry, refinements in the technique are ongoing. One refinement is the dual damascene method. In the dual damascene method vias, interconnects, and lines are formed in a dielectric at two different levels. In terms of the example of the damascene process in the preceding paragraph, the dual damascene process adds a second via, or interconnecting line, in the deposited oxide that extends from the new (oxide) surface to a level in the oxide between the underlying substrate surface and the new (oxide) surface. The dual damascene method is described in greater detail in FIGS. 1–6 as prior art in co-pending patent application Ser. No. 08/665,014 filed Jun. 10, 1996, entitled "Method for Transferring a Multi-level Photoresist Pattern", invented by Tue Nguyen, Sheng Teng Hsu, Jer-shen Maa, and Bruce Dale Ulrich, Docket No. SMT 162 which is assigned to the same assignees as the instant patent.

One known method of performing the dual damascene process is through multiple photoresist mask and etch steps. A single level photoresist profile is formed on a layer deposited dielectric and a via pattern is formed by etching to a first interlevel in the dielectric material. At this point in the process the via is only partially etched. The photoresist is then stripped and a second single layer photoresist profile is formed on the dielectric surface to form an interconnect pattern to a second interlevel in the dielectric material. The interconnect is formed by etching. Coincident with etching the interconnect, the via is etched such that interconnects in underlying substrate layers are exposed to allow electrical contact. Aligning the photoresist profiles is a problem using this method. If the two photoresist profiles are not aligned correctly, then intersecting features in the dielectric material will be misaligned. That is, a conductive line associated with the first photoresist pattern may not correctly intersect a via associated with the second photoresist profile. Alignment errors can be corrected by making the intersecting features oversized, but this takes away from the overall goal of reducing the size of connecting lines and vias. Alignment problems reduce yields, and increase cost and the complexity of IC processes.

Another known method of performing the dual damascene process uses photoresist profiles having multiple levels, or thicknesses, to form vias and interconnect at multiple levels in an IC dielectric. An electron beam or laser may be used to directly write a multi-level pattern into photoresist, but is not commercially practical. So called "gray-tone" masks, formed from repetitive patterns of dots that appear as transparent holes on the chromium mask of the reticle, have also been used to form multi-level resist profiles as described by Pierre Sixt, "Phase Masks and Gray-Tone Masks", Semiconductor FabTech, 1995, page 209. Sixt also gives a general description for a process to transfer the multi-level resist onto a dielectric. The process relies on a one-to-one etch selectivity between the dielectric material and the resist material. The dielectric and the overlying photoresist profile are then etched together so that any exposed dielectric material is etched at the same rate as overlying photoresist material. Thinner layers of resist cause a deeper etch into the dielectric so that, after etching, the dielectric shape generally resembles the photoresist pattern overlying the dielectric at the beginning of the process. One problem with this method is finding dielectric materials and photoresist materials that have identical etch selectivity. It is also difficult to transfer various features, especially small or relatively complicated features, into a dielectric using this method. Polymers and by-products of the etch process tend to collect on areas of the resist pattern, changing the shape and etch rates of the resist profile. Further, the article discloses that vias made by this method have a relatively large size, approximately 25 μm, due to the resolution limits imposed with the pixel size in the gray-tone mask. Vias of this size are approximately two orders of magnitude larger than vias formed through conventional methods, and are unsuited for most IC processes.

It is well known in the art to use a multi-level reticle for the phase shifting of light in the production of photoresist masks. These multi-level, or phase shifting, reticles are used to reduce the constructive, and unintended, interference of light patterns diffracting from a reticle aperture. Constructive interference is the in-phase addition of light from two different sources. The incidence of light, even a highly coherent light, upon an aperture produces at least some diffraction. The pattern of light diffracted through an aperture is dependent upon the aperture shape and wavelength of light as is well known in the art.

A conventional, or bi-level reticle, is composed of a translucent substrate which transmits essentially all incident light, and an opaque substrate which transmits substantially no incident light. Light transmitted through a square aperture bi-level reticle produces the general aperture shape with some diffraction of light around the edges of the aperture shape. One general problem with constructive interference occurs in the area between two vias to be formed on a photoresist mask from light passing through the two corresponding aperture holes in the reticle. Constructive interference of light transmitted through the two via apertures often occurs between the two vias, causing an unintended area of thin resist which ultimately translates into an imperfection in the IC substrate etched from the photoresist mask. This process is explained in greater detail in FIG. 1 in the Detailed Description of the Preferred Embodiment of this invention.

Phase shifting reticles were developed to minimize constructive interference problems, as mentioned above. The general principle of phase shifting reticles is to change the phase of light to promote destructive interference in the areas of the photoresist mask subject to multiple diffraction sources. That is, the light from one diffraction source is adjusted to have a phase difference of 180° from the second diffraction source so that the diffraction effect of the two sources are self canceling.

A typical method of performing this 180° phase shift is to use so called "half tone", or partially transmitting, films. A typical phase shifting reticle, using a half tone film, is disclosed in U.S. Pat. No. 5,358,827 by Garofalo, et al. Other phase shifting multi-level reticles are disclosed by Kobayashi, Oka, Watanabe, Inoue and Sakiyama in "The Control of Sidelobe Intensity of the Chrome Pattern (COSAC) in Half-Tone Phase shifting Mask", Extended Abstracts of the 1995 International Conference on Solid State Devices and Materials, Aug. 21 through 24, 1995, pp. 935–937. Another source describing a similar phase shifting reticle is by Levenson, Viswanathan and Simpson, "Improving Resolution in Photolithography with a Phase shifting Mask", IEEE Transactions on Electron Devices, Vol. ED-29, No. 12, December, 1982.

The above disclosures reveal a reticle constructed of a transparent substrate made of a quartz material to transmit substantially all incident light. The reticle is constructed with a half-tone, or phase shifting film over the substrate to shift the phase of transmitted light. Over the half-tone layer is an opaque film to substantially block transmitted light. Through the use of phase shifting, to produce destructive interference, these reticles produce light at substantially two intensities, 100% intensity and 0% intensity, to form a single-level photoresist mask as is well known in the art. Alternately, it can be said that the reticle produces light at a single intensity (100% transmission), and otherwise blocks (0% transmission) the light. Phase shifting performed with the single level photoresist mask is for the purpose of more clearly defining features, such as vias, and to reduce the effects of diffraction. Typically, conventional half-tone material is chosen with regard to its phase shifting characteristics, as opposed to its light attenuation characteristics. Therefore, the half-tone films in the phase shifting reticles are chosen to phase shift transmitted light 180° while providing substantially no attenuation, as disclosed in the Levenson article. Alternately, half tone films are chosen to phase shift transmitted light 180° while substantially attenuating the intensity of transmitted light as disclosed in Kobayashi, et al.

It would be advantageous to utilize the intensity attenuation characteristics of half-tone films in the production of photoresist masks.

It would also be advantageous to use the intensity attenuation characteristics of half-tone films to make photoresist masks, or patterns, having multi-levels to perform etching into IC substrate material to a plurality of depths.

It would be advantageous to combine the light intensity attenuation characteristics of a half-tone film to create photoresist masks with a plurality of thicknesses, with phase shifting characteristics of a half-tone film to create sharp features and to reduce errors caused by diffraction.

Accordingly, a reticle is provided through which incident light is passed to define predetermined areas of illumination on a light sensitive photoresist surface. The reticle comprises a first transmission level film producing transmitted light of a first intensity, a second transmission level film producing transmitted light of a second intensity greater than the first intensity, and a third transmission level film producing transmitted light of a third intensity greater than the second intensity.

Second transmission level film transmits more than approximately 10%, but less than approximately 90%, of incident light, whereby the attenuation characteristics of the second transmission level film are approximately mid-way between the first and third transmission level film attenuation characteristics, such that the reticle, when directed to a light sensitive surface, forms at least three distinctive intensities on the illuminated areas of photoresist.

A method is also provided for using photolithography to form a reticle on a reticle substrate, to transmit incident light. The method comprises the steps of depositing at least one film, to partially transmit incident light, over the reticle substrate, the partially transmitting film diminishing the intensity of light at predetermined percentage in transmission through the partially transmitting film, and the substrate passing substantially all light incident to the substrate. A method comprises the step of depositing an opaque film over the reticle substrate the opaque film blocking light so that substantially all incident light is attenuated. A method also comprises the step of etching selective portions of the opaque film deposited earlier, and the partially transmitted film deposited earlier, to reveal predetermined areas of reticle substrate and partially transmitting film, whereby light introduced to the reticle is transmitted through the predetermined areas of reticle substrate, partially transmitting film, and remaining opaque film to produce at least three intensities of light.

Further, a method is provided for forming a photoresist profile on a substrate comprising the steps of providing a layer of photoresist having a predetermined thickness on the substrate, and directing light to the photoresist through a reticle having a first transmitting intensity to create a first exposure pattern in the photoresist, and the reticle having a second transmitting intensity to create a second exposure pattern in the photoresist. The method also including the step of developing the photoresist to remove a first thickness of photoresist, less than said predetermined thickness, in the areas of said first exposure pattern, and to remove a second thickness of the photoresist in the areas of the second exposure pattern, whereby the profile includes areas of photoresist having a plurality of different thicknesses.

BRIEF DESCRIPTION OF THE DRAWINGS

FIG. 2 is a partial cross-sectional view of a tri-level reticle with an overlying first photoresist pattern.

FIG. 3 is a partial cross-sectional view of a tri-level reticle of FIG. 2 after the first etch step.

FIG. 4 is a partial cross-sectional view of the tri-level reticle of FIG. 3 with an overlying second photoresist pattern.

FIG. 5 is a partial cross-sectional view of the tri-level reticle of FIG. 4 following the second etch step.

FIG. 16 illustrates the steps of the method of the present invention to pattern a photoresist film with a plurality of thickness from a single exposure to light.

DETAILED DESCRIPTION OF THE PREFERRED EMBODIMENT

Figure 1:
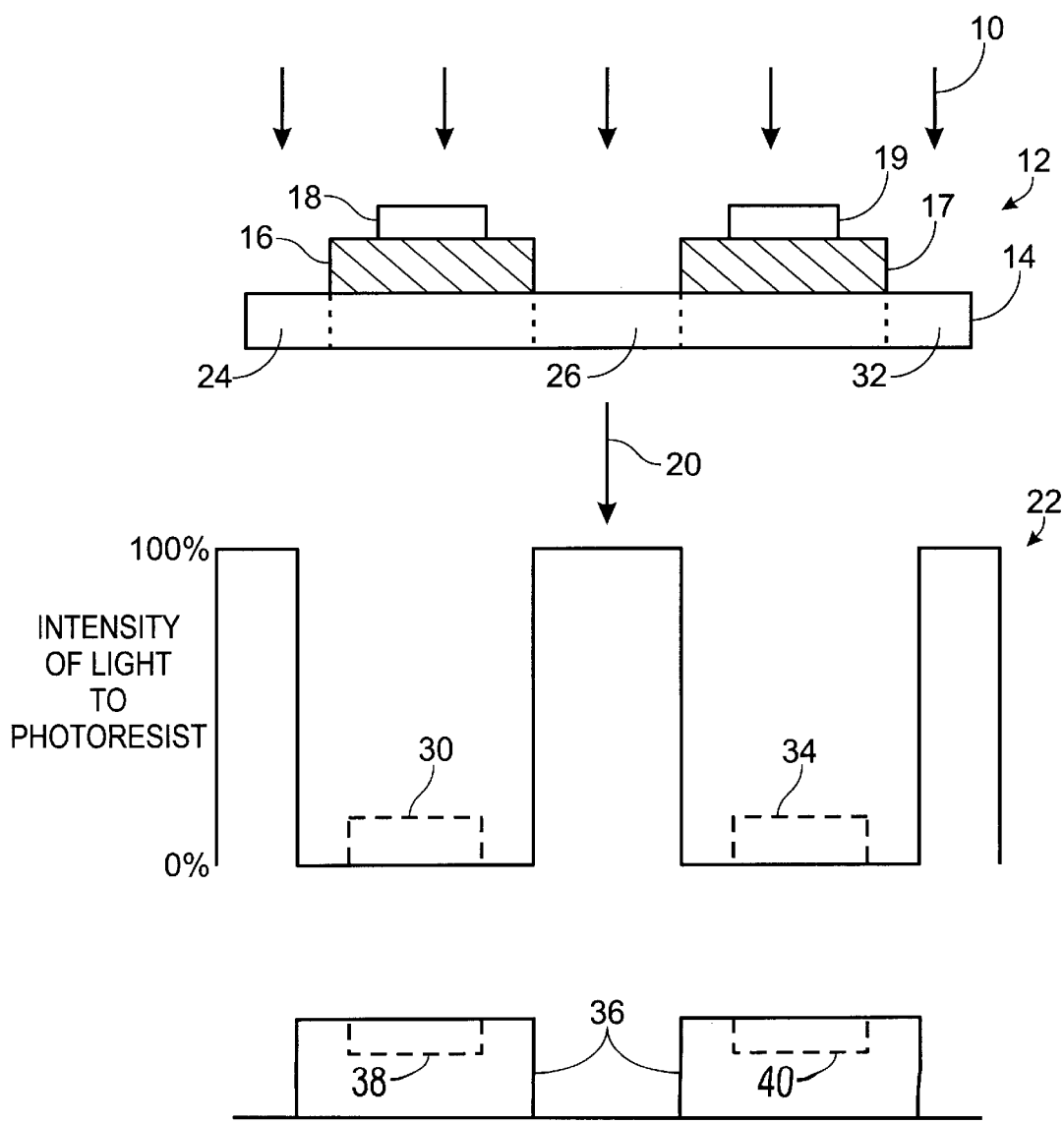
FIG. 1 is a partial cross-sectional view of a reticle to form three vias, and the relative intensities of light transmitted through the reticle (prior art).

FIG. 1 is a partial cross-section view of a reticle used to form three vias, and the relative intensities of light transmitted through the reticle. Incident light 10, from a light source not shown, is introduced to a reticle 12. Reticle 12 comprises a reticle substrate 14 made from a material such as quartz. Overlying substrate 14 are two areas of a phase shifting film 16 and 17. Overlying phase shifting film 16 and 17 are two areas of an opaque film 18 and 19, such as chrome. Transmitted light 20 exits reticle 12 to a photoresist film, not shown. A graph 22 of the relative light intensities is displayed. Where incident light passes through substrate 14, the transmitted light is substantially at a 100% intensity relative to the incident light. In areas where the incident light is introduced to phase shifting film 16 and opaque film 18, the transmitted light is substantially zero. The diffraction of light passing through a first aperture 24 and a second aperture 26 is mitigated by the effect of light transmitted through phase shifting film 16. Without phase shifting film 16, the diffraction through apertures 24 and 26 constructively interferes to form the higher intensity profile 30 indicated by the dotted lines in graph 22. Likewise, if phase shifting film 17 is removed, a higher intensity, caused by constructive interference from aperture 26 and aperture 32, is formed indicated by dotted line 34. The areas of higher, unintended, intensity indicated by dotted lines 30 and 34 yield deformities in a photoresist profile 36 formed from reticle 12. The deformities in photoresist 36 indicated by dotted lines 38 and 40 will ultimately yield unintended etching in an IC substrate etched from photoresist profile 36.

FIGS. 2–5 illustrate the formation of a tri-level reticle using the method of the present invention. FIG. 2 is a partial cross-sectional view of a tri-level reticle with an overlying first photoresist pattern. Reticle 50 comprises a quartz substrate 52, a partially transmitting film 54, an opaque film 56, and overlying first photoresist pattern 58.

Photoresist 58 is patterned with an opening 59 for etching into reticle 50. FIG. 3 is a partial cross-sectional view of tri-level reticle 50 of FIG. 2 after the first etch step. An opening etched through opaque film 56 and partially transmitting film 54 to exposes a predetermined area 60 of quartz substrate 52. The opening underlies opening 59 in resist 58.

FIG. 4 is a partial cross-sectional view of tri-level reticle 50 of FIG. 3 with an overlying second photoresist pattern 62. Second resist pattern 62 has an opening to reveal a predetermined area 63 of opaque film 56.

FIG. 5 is a partial cross-sectional view of tri-level reticle 50 of FIG. 4 following the second etch. An opening etched through area 63 of opaque film 56 exposes a predetermined surface area 64 of partially transmitting film 54.

FIG. 5 describes reticle 50 through which incident light is passed to define predetermined areas of illumination on a light sensitive photoresist surface, reticle 50 comprises a first transmission film 56 producing transmitted light of a first intensity, a second transmission level form 54 producing transmitted light of a second intensity greater than the first intensity, and a third transmission level film 52 producing transmitted light of a third intensity greater than the second intensity. In the preferred embodiment of the invention third transmission level 52 is a substrate, second transmission level 54 overlies third transmission level substrate 52, and first transmission level film 56 overlies the second transmission level film 54.

It is a feature of the present invention that first transmission level film 56 is an opaque film selected from a group consisting of chromium (Cr), chromium oxide (CrO), and iron oxide, whereby first transmission level film 56 substantially blocks incident light. It is also a feature of the invention that third transmission level 52 is selected from the group consisting of quartz, synthetic quartz, and glass, whereby third transmission level film 52 is transparent to pass substantially all incident light. In the preferred form of the invention first transmission level film 56 has a first transmission level opening, through first transmission level film 56, to reveal a predetermined area 64 of second transmission level film 54, and second transmission level area 64 has a second transmission level opening, through second transmission level 54, to reveal a predetermined area 60 of third transmission level film 52. Typically, the thickness of the chromium opaque layer is 110 nanometers (nm), the partially transmitting film 80 nm, and the quartz substrate 0.09 inches.

Second transmission level film 54 retards the phase of light in a predetermined number of degrees whereby the phase difference between reticle transmission level films improves the resolution in transmitted light intensities to reduce constructive interference between adjacently illuminated areas of photoresist. It is a feature of the invention that second transmission level film 54 retards the phase of transmitted light approximately 90°.

Figure 6:
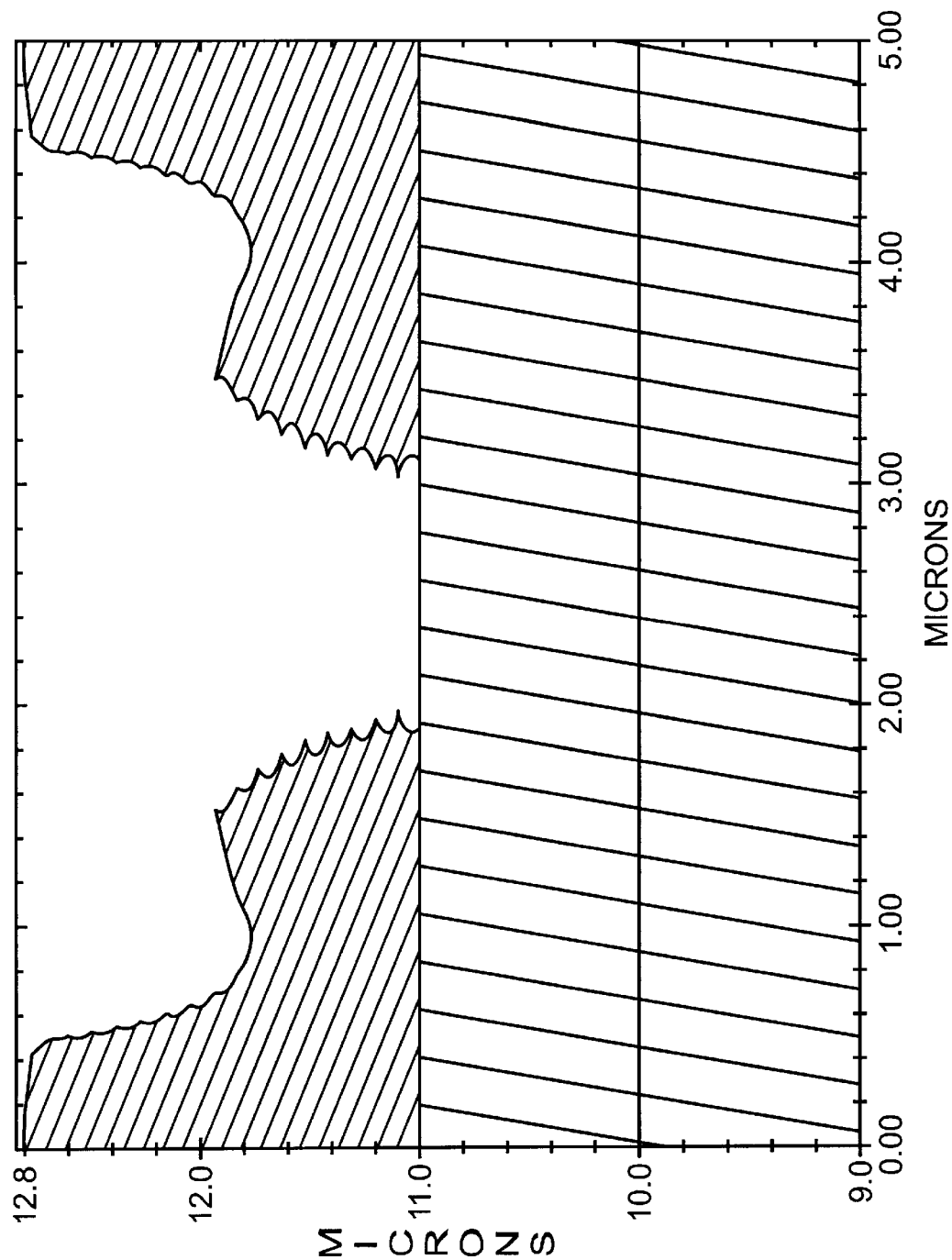
FIG. 6 is a partial cross sectional view of a bi-level photoresist pattern formed from a tri-level reticle.
Figure 7:
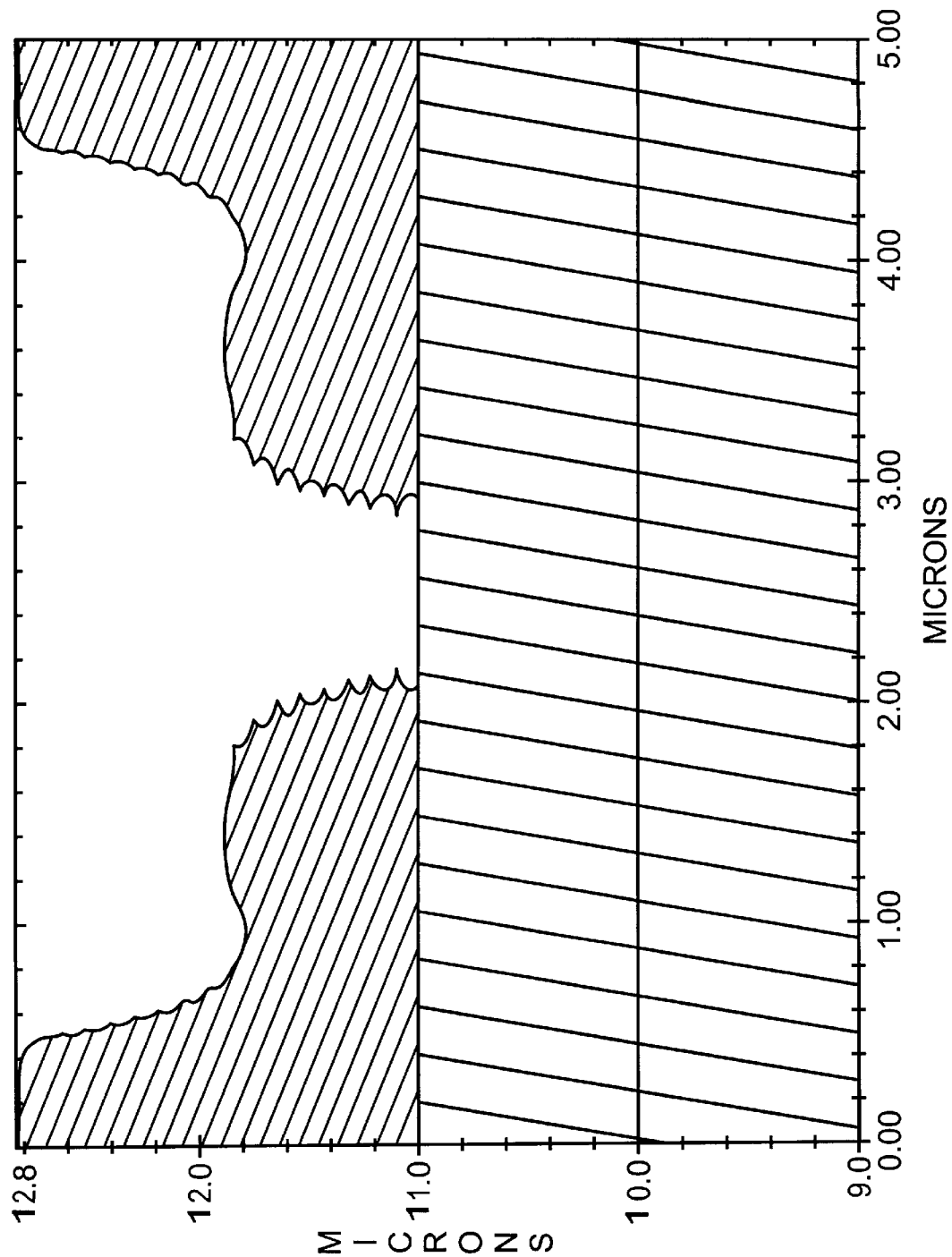
FIG. 7 is a partial cross sectional view of a bi-level photoresist pattern formed from a tri-level reticle using phase shifting to enhance the resolution of the pattern.

FIG. 6 is a partial cross-sectional view of a bi-level photoresist pattern formed from a tri-level reticle. The photoresist thickness, before exposure to light through a reticle, is approximately 2 microns, shown in the Fig. between the 11.0 and 12.8 microns demarcations. After exposure to light through a reticle, the bi-level resist pattern in FIG. 6 is developed. Approximately 1 micron of resist has been removed to form an intermediate level having a thickness of approximately 0.5 microns. To decrease the size of the via, phase shifting techniques, well known in the art to produce single-level resist profiles, are used. FIG. 7 is a partial cross-sectional view of a bi-level photoresist pattern formed from a tri-level reticle with phase shifting to enhance the resolution of the pattern. The via is substantially smaller than the via of FIG. 6, and intermediate surface surrounding the via is leveler. Thus the reticle uses a partially transmitting film to create an intermediate intensity to form an intermediate resist level, and the reticle uses the partially transmitting film for phase shifting to control resolution. The use of 180° phase shifting film has been found to cause excess cancellation in the area of the resist surrounding the via. Optimum results are obtained when using only partial cancellation of diffracted light. A partially transmitting film having a phase shift of 90°, and a transmission intensity of 30% (attenuating 70% of incident light) is found to be effective.

In the preferred form of the invention second transmission level, or partially transmitting, film 54 is selected from the group consisting of indium tin oxide and molybdenum silicon oxynitride, whereby second transmission level film 54 attenuates the intensity of transmitted light, a predetermined percentage.

In the preferred form of the invention second transmission level film 54 transmits more than approximately 10%, but less than approximately 90%, of incident light, whereby the attenuating characteristics of second transmission level 54 are approximately mid-way between first transmission level film 56 and third transmission level film 52 attenuation characteristics, such that reticle 50, when directed to a light sensitive surface, forms at least three distinctive intensities on the illuminated areas of photoresist.

It is a a feature of the invention that the incident light introduced to reticle 50 has a predetermined wavelength and a predetermined intensity. I-line light, generated from a mercury arc lamp, having a wavelength of 0.365 µm, is typically used as the incident light source, not shown. Alternately, various other wavelengths may be used such as a krypton fluoride laser having a wavelength of 0.248 µm. The intensity of light upon the reticle is typically from 500 to 1000 watts. The method of the present invention is not limited to a special band of light wavelengths, but is applicable to all suitable wavelengths.

Figure 8:
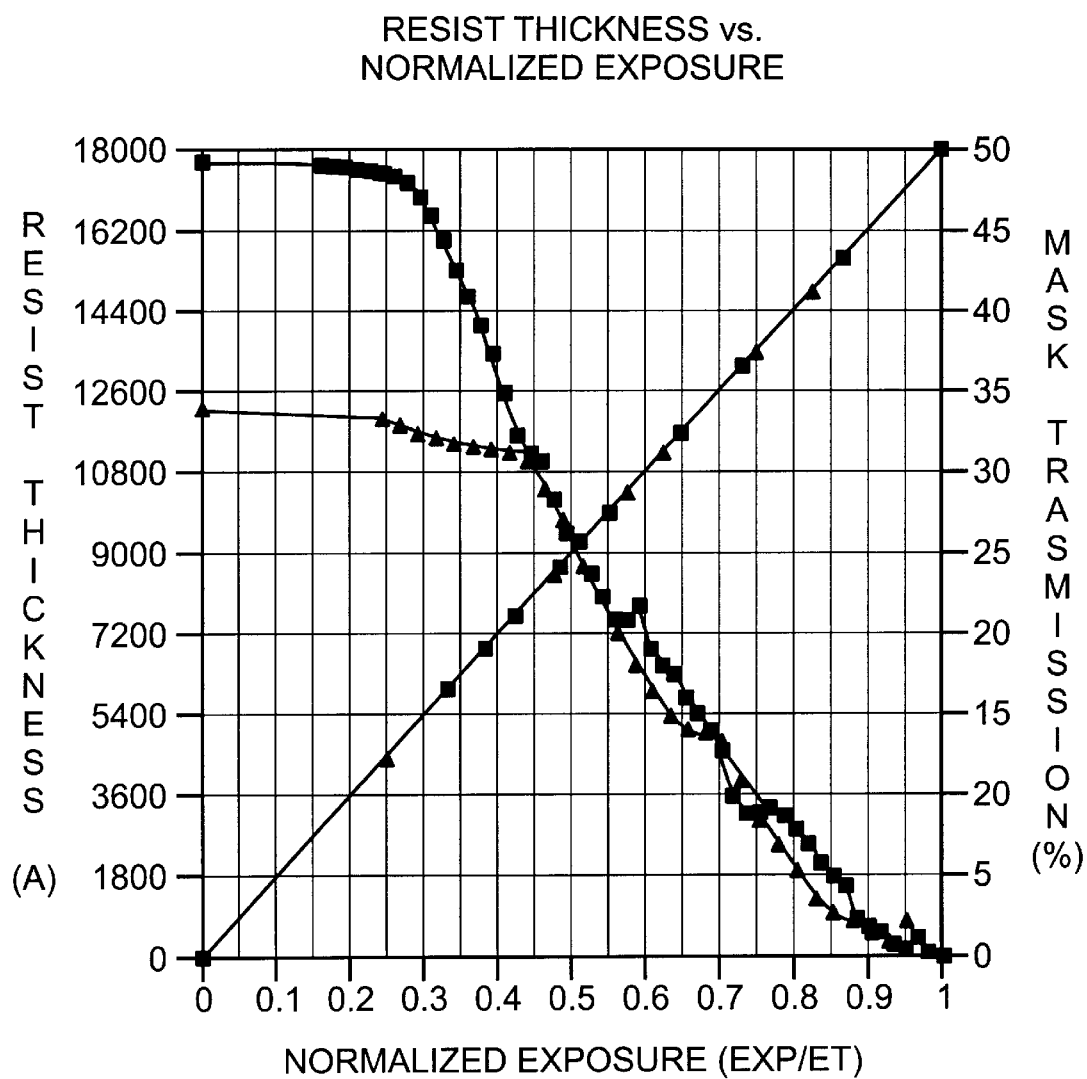
FIG. 8 is a graph illustrating the relationship between resist thickness, exposure time, and the transmission characteristics of a partially transmitting film.

FIG. 8 is a graph illustrating the relationship between resist thickness, exposure time, and the transmission characteristics of a partially transmitting film. A normalized exposure of 1.0 corresponds to the exposure time required to completely remove the photoresist (after development.) Typically, it requires approximately 100 to 300 ms to completely expose the photoresist. Note that the use of a partially transmitting film (mask) of 30% transmission allows the use of a normalized exposure of approximately 0.5 to yield a resist thickness of about 10,000 Angstroms. The intermediate level thickness in the photoresist can be adjusted by changing the dosage of light on the resist, with dosage being a function of light intensity and time. However, low dosages (much less than 0.5 normalized exposure) do not provide enough light to consistently form a via through the resist profile. High dosages of light (much more than 0.5 normalized exposure) often cause the vias to be over-sized, and the vias walls to become sloped. Therefore, the use of a 30% transmission film allows an exposure time to be selected to correctly dose the resist so that the intermediate level is formed at the proper thickness in the profile, without incorrectly dosing the area of the resist where the via is formed to detrimentally effect the formation of the via through the profile.

Figure 9:
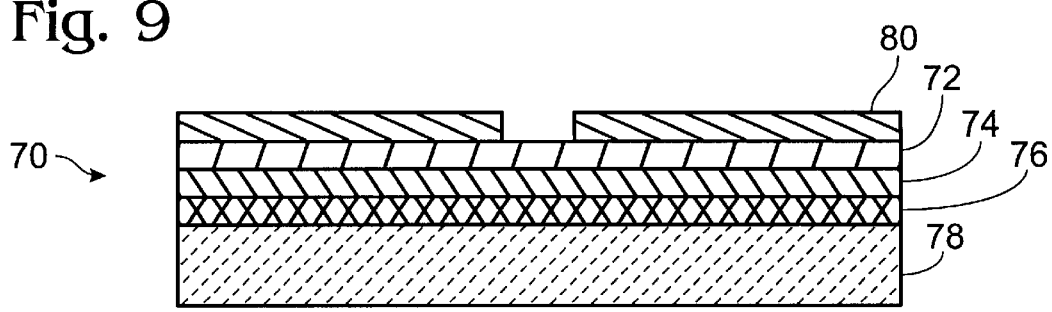
FIG. 9 is a partial cross-sectional view of a multi-level reticle.

FIGS. 9 through 12 illustrate the method of forming a multilevel reticle with a plurality of second transmission level films. FIG. 9 is a partial cross-sectional view of a multi-level reticle 70. Reticle 70 comprises an opaque film, or first transmission level film 72, a first partially transmitting film 74, a second partially transmitting film 76, a transparent substrate, or third transmission level film 78, and an overlying first photoresist profile 80 with an opening.

Figure 10:
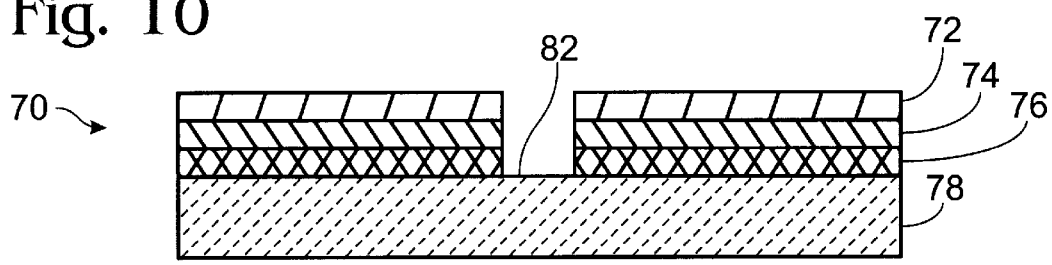
FIG. 10 is a partial cross-sectional view of the multi-level reticle of FIG. 9 after the first etch step.

FIG. 10 is a partial cross-sectional view of multi-level reticle 70 of FIG. 9 after the first etch step. An opening has been etched through opaque film 72 second partially transmitting film 76 and first partially transmitting film 74 to reveal a predetermined surface area 82 of substrate 78. The etched opening underlies the opening in the pattern of resist 80 shown in FIG. 9.

Figure 11:
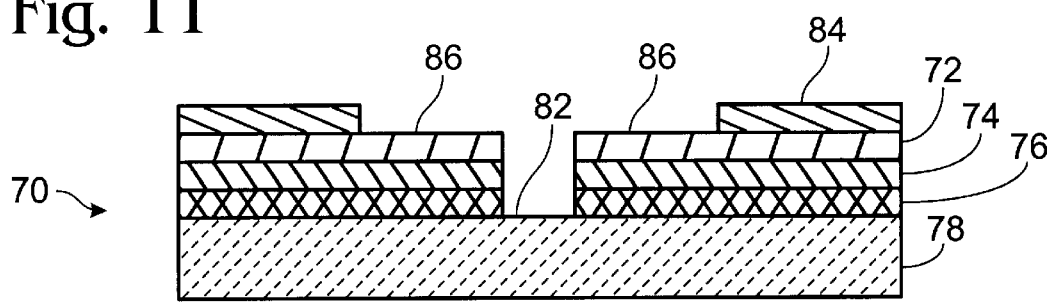
FIG. 11 is a partial cross-sectional view of the multi-level reticle of FIG. 10 with an overlying second photoresist pattern.

FIG. 11 is a partial cross sectional view of multi-level reticle 70 of FIG. 10 with an overlying second photoresist profile 84. Resist profile 84 has an opening to reveal predetermined surface areas 86 of opaque film 72.

Figure 12:
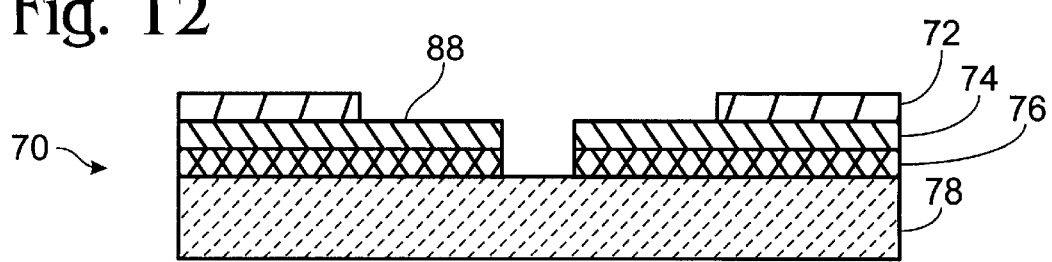
FIG. 12 is a partial cross-sectional view of the multi-level reticle of FIG. 11 after the second etch step.

FIG. 12 is a partial cross-sectional view of multi-level reticle 70 of FIG. 11 after the second etch step. After etching, a predetermined surface area 88 of first partially transmitting film 74 is revealed. Light incident to reticle 70 is transmitted through opaque film 72 at a first transmission level. Incident light is transmitted through first partially transmitting film 74 and second partially transmitting film 76 at a second intensity. Incident light is transmitted through substrate 78 in the area of exposed surface 82 at a third intensity.

Reticle 70 of FIGS. 9 through 12 is as reticle 50 of FIGS. 2 through 5, in which a plurality of second transmission level films are provided. Each of the plurality of second transmission level films 74 and 76 producing transmitted light at one of a plurality of second intensities greater than the first intensity and less than the third intensity, whereby light in a range of second intensities is provided. The invention is not limited to only two second transmission levels films, more may be used. Alternately, reticle 70 is as reticle 50 with the first transmission level film made up of a plurality of second transmission level films 74, 76, and 72, each one of the plurality of second transmission levels films 74, 76, and 72 being a partially transmitted film layer, such that the intensity characteristics of light transmitted through the plurality of second level films 74, 76, and 72 are cumulative to yield the light transmission characteristics of the first transmission level film.

Figure 12A:
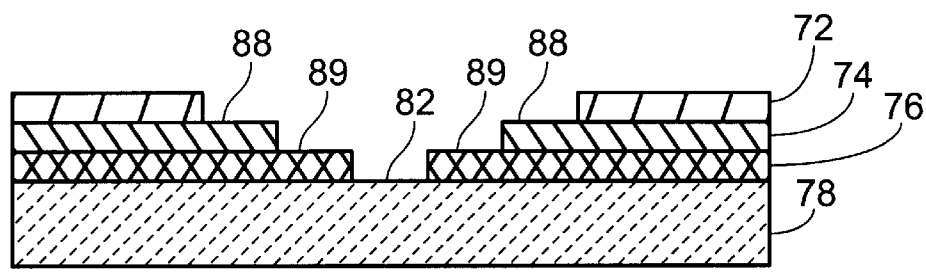
FIG. 12a is a partial cross-sectional view of a multi-level reticle having a plurality of partially transmitting level films.

That is, second transmission level films may be combined, as shown in FIG. 12, to get a transmission attenuation and phase shift that is a combination of two or more partially transmitting films. Alternately, FIG. 12a is a partial cross-sectional view of a multi-level reticle having a plurality of partially transmitting level films. A third photoresist pattern can be formed to reveal a portion of first transmission level film 74 which is in turn etched to reveal an area 89 of second transmission level film 76. Light is then transmitted through the reticle at four intensities (and phases); approximately 0% through the opaque layer, through area 88 having the combination of first and second partially transmitting films 74 and 76, through area 89 which is just second transmission level film 76, and through area 82 of quartz substrate 78. This process can be repeated with more added layers of partially transmitting films.

It is a feature of the invention that the first transmission level film includes a first number, that is substantially all, of the multiple partially transmitting film layers 74, 76, and 72, and the second transmission level film includes a second number, fewer than the first number, of the partially transmitting film layers 74, 76, and 72. The invention is not limited to a first transmission level film of only three partially transmitting film layer, more may be used.

Figure 13:
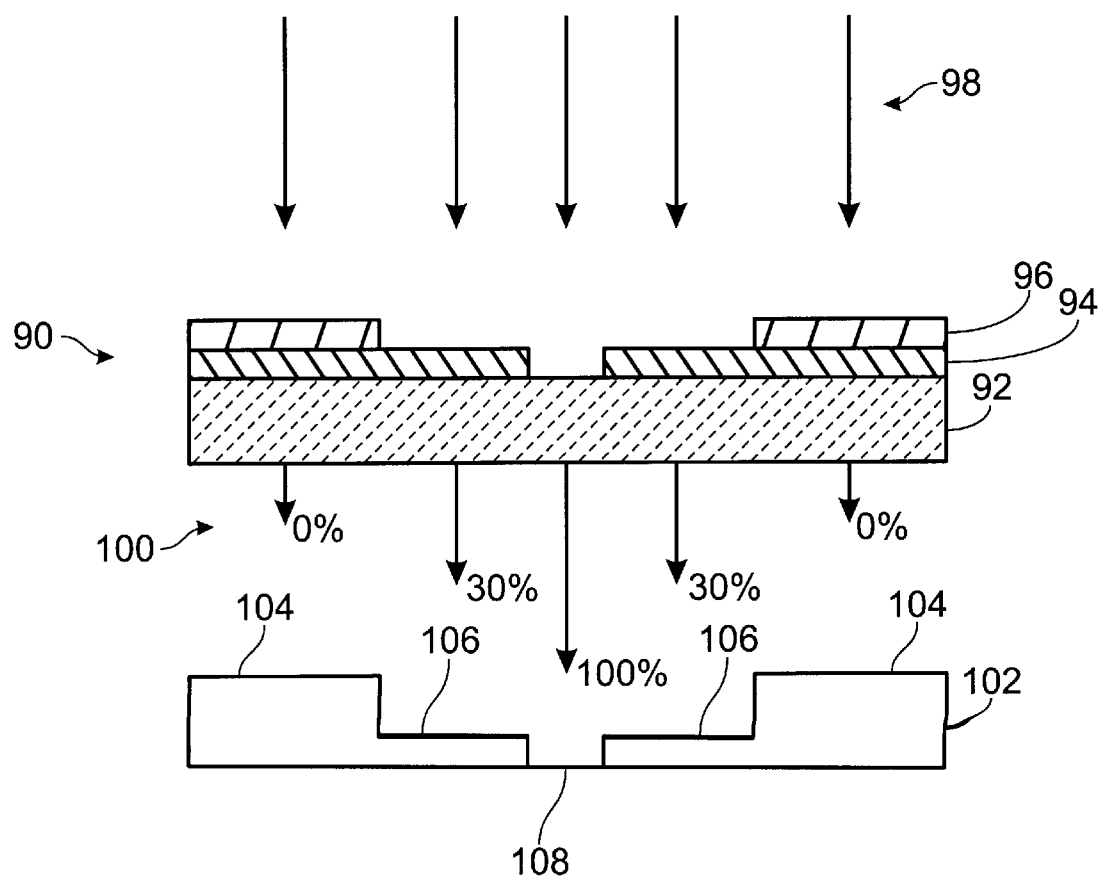
FIG. 13 is a partial cross-sectional view of a tri-level reticle transmitting incident light at three intensities on a light sensitive surface.

FIG. 13 is a partial cross-sectional view of a tri-level reticle transmitting incident light at three intensities on a light sensitive surface. Tri-level reticle 90 comprises a transparent substrate 92, a partially transmitting film 94, and an opaque film 96. Light 98, incident to reticle 90, is output as transmitted light 100 at a plurality of intensities. To simplify the explanation, the lens typically used between reticle 90 and a photoresist mask 102 is not shown. Although some exposure systems expose photoresist to the same size as the reticles, it is typical to use a lens in a reduction system to create a pattern on the resist that is five, or ten, times smaller than the reticle pattern. Light transmitted through opaque film 96 is substantially blocked so as to substantially not effect photoresist 102 in a first area 104 of photoresist 102. Light transmitted through partially transmitting film 94 has a transmitted intensity of 30% relative to incident light 98 to form a first level 106 in photoresist 102. Incident light 98 passing through substrate 92 at a third intensity forms an opening 108 in resist 102.

Alternately, FIG. 13 can be described as reticle 90 transmitting incident light 98 to create a profile pattern with a plurality of thicknesses 102. Reticle 90 comprising a partially transmitting film 94, partially transmitting film 94 attenuating a predetermined percentage of incident light to form a photoresist area 106 having a first thickness. Reticle 90 also comprising opaque film 96, opaque film 96 blocking substantially all incident light 98 to form photoresist area 104 having a second thickness greater than the first thickness. Reticle 90 comprising a transparent substrate 92, substrate 92 passing substantially all incident light to form photoresist area 108 having a third thickness less than the first thickness. In the preferred form of the invention the third thickness is substantially zero so that an opening is formed in photoresist film 102.

In yet another alternate explanation, reticle 90 transmits incident light 98 to create a profile pattern with a plurality of thicknesses on a light sensitive photoresist film 102, reticle 90 having a transparent substrate 92, passing substantially all incident light 98, to form an opening 108 in photoresist film 102, reticle 90 also having opaque film 96, blocking substantially all incident light 98 to form a photoresist area having a second thickness, with reticle 90 comprising partially transmitting film 94, attenuating a predetermined percentage of incident light 98, to form photoresist area 106 having a first thickness, the first thickness being approximately ⅓ the second thickness.

Figure 14:
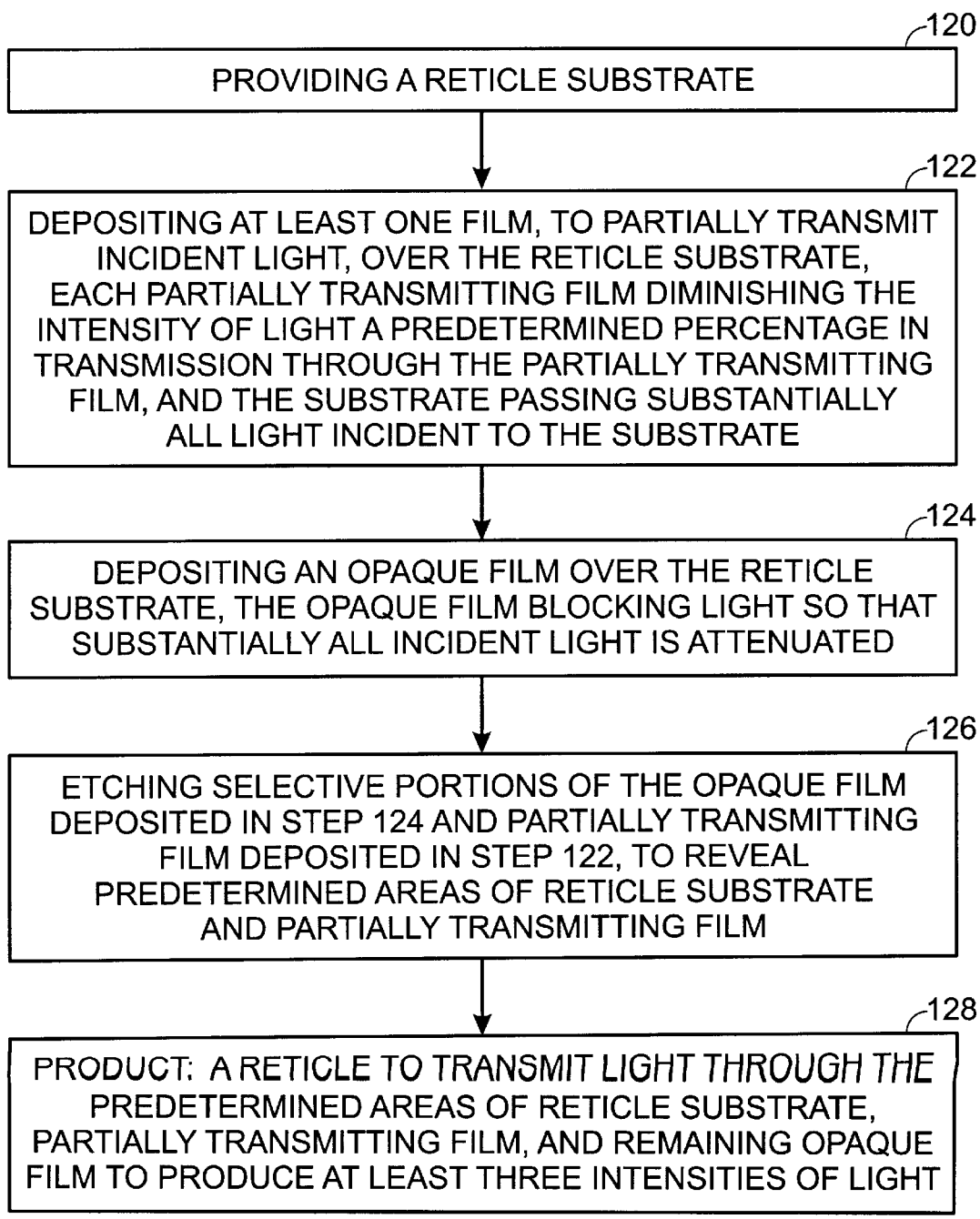
FIG. 14 illustrates the steps in the method of the present invention to form a tri-level reticle.

FIG. 14 illustrates the steps of the method of the present invention to form a tri-level reticle. The reticle transmits incident light. It is a feature of the invention that the transmitted light illuminates areas of a light sensitive surface, each area being illuminated with a predetermined level of transmitted light. Step 120 is providing a reticle substrate. Step 122 is depositing at least one film, to partially transmit incident light, over the reticle substrate, the partially transmitting film diminishing the intensity of light a predetermined percentage in transmission through the partially transmitting film, and the substrate passing substantially all light incident to the substrate. Step 124 is the depositing of an opaque film over the reticle substrate, the opaque film blocking light so that substantially all incident light is attenuated. Step 126 is etching selective portions of the opaque film deposited in Step 124, and the partially transmitting film deposited in step 122, to reveal predetermined areas of reticle substrate and partially transmitting film. Step 128 is the product, a reticle to transmit light through the predetermined areas of reticle substrate, partially transmitting film, and remaining opaque film to produce at least three intensities of light. It is a feature of the invention that the three intensities of transmitted light produce a patterned profile of at least two thicknesses in a light sensitive surface, typically with an opening through the surface.

It is a feature of the invention that Step 122 includes the deposition of a plurality of partially transmitting films in sequential layers with the light transmission characteristics of each partially transmitting film being cumulative to progressively attenuate incident light passing through the partially transmitted films, in which the plurality of partially transmitting films have differing etch selectivity, so that the etching of adjacent partially transmitting films requires separate etch processes. It is also a feature that Step 126 includes etching selective portions of predetermined partially transmitting films to reveal underlying partially transmitting film layers, whereby a plurality of partially transmitting film combinations provides a plurality of transmitting light intensities.

It is a feature of the present invention that Step 122 includes the deposition of a plurality of partially transmitting films, with the cumulative attenuation of the plurality of partially transmitting films substantially replicating the light transmission characteristics of the opaque film, so that Step 124 includes Step 122, since the deposition of the plurality of partially transmitting films substantially blocks the transmission of light.

In the preferred embodiment of the invention Step 122 includes the deposition of the partially transmitting film in a layer adjacent to, and overlying, the reticle substrate, and Step 124 includes the deposition of the opaque film in a layer adjacent to, and overlying, the partially transmitting film, and in which Step 126 includes etching selected portions of the opaque film so that light is introduced to the partially transmitting film, without transmission through the opaque film, and in which Step 126 includes etching selected portions of the partially transmitting and opaque films so that light is introduced to a selected portion of the reticle substrate without transmission through either the opaque film or the partially transmitting film, whereby light of at least three intensities illuminates the light sensitive surface.

In the preferred form of the invention Step 126 includes the steps of forming a first layer of photoresist, having a first pattern with an opening through the first layer, overlying the opaque film. Step 126 also includes the step of etching a predetermined area of the opaque film, revealed through the opening in the pattern of the photoresist formed earlier, to reveal a first area of the partially transmitting film underlying the opaque film, and etching the first area of the partially transmitting film to reveal a predetermined area of the reticle substrate underlying the partially transmitting film. Step 126 further includes the step of forming ea second layer of photoresist, having a second pattern with an opening through the second layer, overlying the opaque film. Finally, Step 126 includes the step of etching a predetermined area of the opaque film, revealed through the opening in the second pattern in the photoresist formed above, to reveal a second area of the partially transmitting film underlying the opaque film, whereby light introduced to the predetermined area of the reticle substrate is transmitted with a first intensity, light introduced to the second area of the partially transmitting film is transmitted through the partially transmitting film and underlying substrate at a second intensity, and light introduced to the remaining opaque film is transmitted through the opaque film the underlying partially transmitting film, and the substrate at a third intensity to illuminate a light sensitive surface.

Figure 15A:
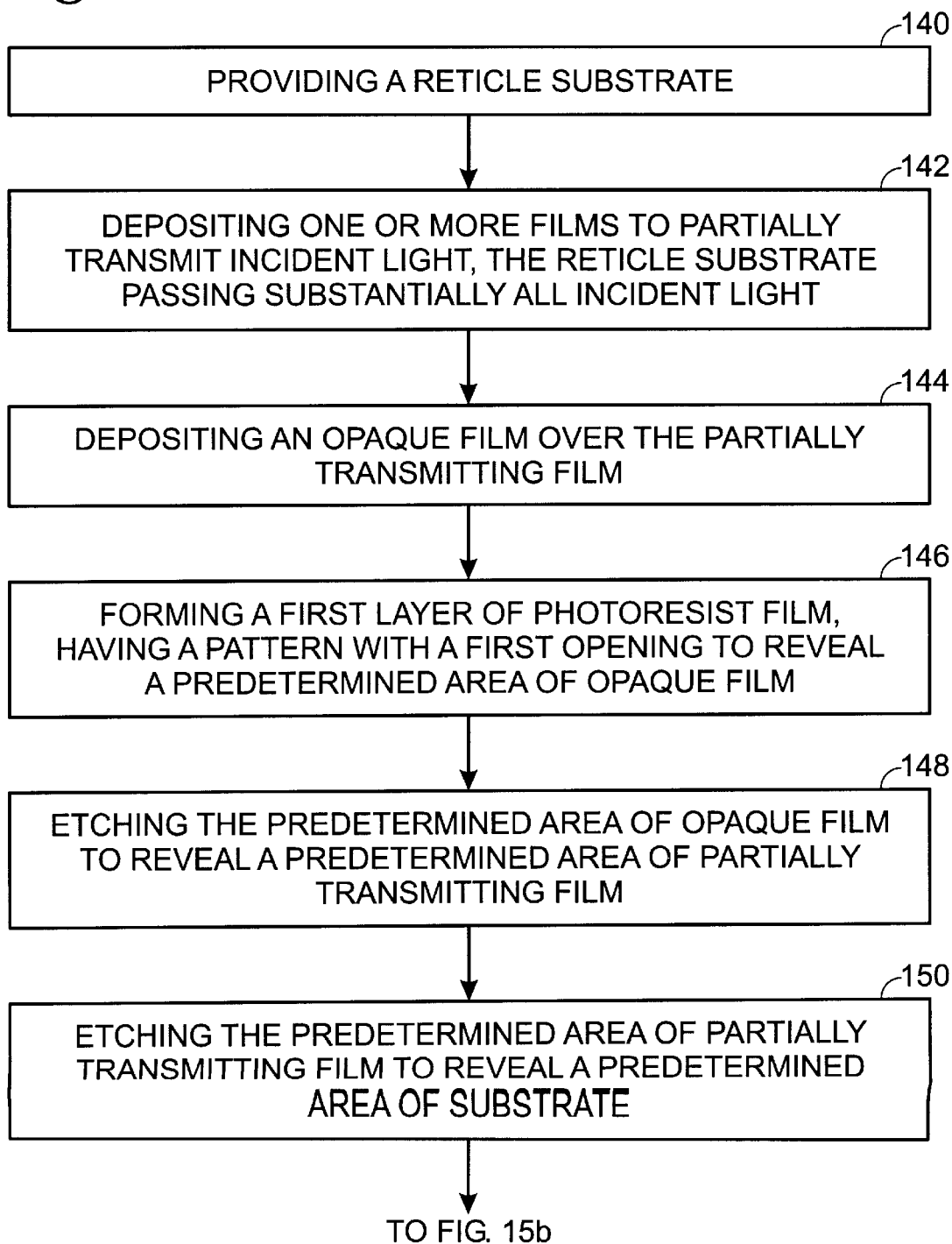
FIGS. 15(a) and (b) illustrate the steps of the method of the present invention to form a multi-level photoresist pattern.

FIG. 15 illustrates the steps of the method of the present invention to form a multi-level photoresist pattern. Step 140 provides a reticle substrate. Step 142 deposits one or more films, to partially transmit incident light, over the reticle substrate, each partially transmitting film diminishing the intensity of light a predetermined percentage in transmission through the partially transmitting film, and the reticle substrate passing substantially all incident light. Step 144 deposits an opaque film, over the partially transmitting film deposited in step 142, the opaque film blocking light so that substantially all incident light is attenuated. Step 146 forms a first layer of photoresist film, having a pattern with a first opening through the photoresist film, over the opaque film deposited in step 144, to reveal a predetermined area of opaque film. Step 148 etches the predetermined area of opaque film, revealed in step 146, to reveal a predetermined area of partially transmitting film.

Step 150 etches the predetermined area of partially transmitting film revealed in step 148 to reveal a predetermined area of the reticle substrate. Step 152 forms a second layer of photoresist film, having a second opening through the photoresist film, over the opaque film to reveal a predetermined area of opaque film. Step 154 etches the predetermined area of opaque film revealed in step 152 to reveal a predetermined area of partially transmitting film. Step 156 exposes a light sensitive photoresist substrate, having a predetermined thickness, to light transmitted through the reticle for a predetermined amount of time, with light being transmitted through the predetermined area of the reticle substrate revealed in step 150 to expose the first photoresist area to a first dosage, with light being transmitted through the predetermined area of the partially transmitting film revealed in step 154 to expose a second photoresist area to a second dosage, and with light being transmitted through the remaining opaque film to expose a third photoresist area to a third dosage. As explained in the discussion of FIG. 8, light dosage is a function of the intensity of the transmitted light on a surface, and the amount of time the surface is exposed to this light.

Step 158 develops the photoresist substrate exposed in step 156 to form a photoresist profile having an opening in the first photoresist area, the photoresist profile having substantially the photoresist predetermined thickness in the third photoresist area, and the photoresist profile having an intermediate thickness, between the predetermined thickness and zero, in the second photoresist area, whereby light introduced to the reticle, formed by revealing predetermined areas of reticle substrate and partially transmitting film, produces at least three intensities of light. Step 160 is a product, a photoresist substrate transformed into a profile of at least two thicknesses and an opening, generally replicating the profile of the multi-level reticle.

FIG. 16 illustrates the steps of the method of the present invention to pattern a photoresist film with a plurality of thicknesses from a single exposure to light. Step 170 provides a light sensitive photoresist film from a single exposure to a light source. Step 172 exposes an area of the photoresist to a first intensity of light to form an opening through the photoresist film, the first intensity of light being substantially unattenuated in transmission from the light source. Step 174 exposes an area of the photoresist to a second intensity of light to form a photoresist area having a first thickness, the second intensity of light being partially attenuated in transmission from the light source. Step 176 exposes an area of the photoresist to a third intensity of light to form a photoresist area having a second thickness greater than the first thickness, the third intensity of light being substantially blocked in transmission from the light source. Step 178 is a product, a photoresist film with a plurality of thicknesses.

Figure 17:
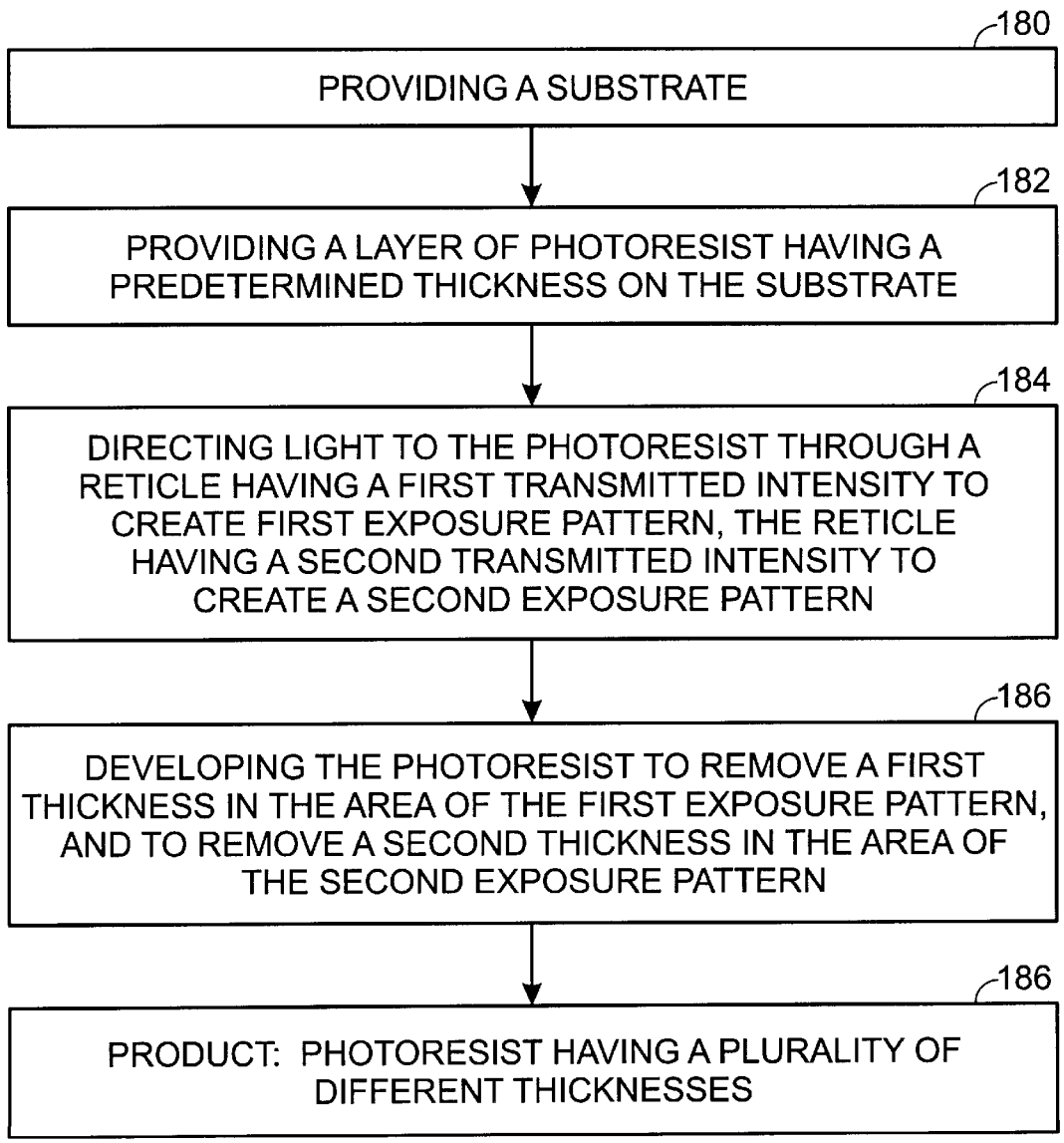
FIG. 17 illustrates the method of the present invention to form a photoresist profile having two exposure patterns from a single reticle.
Figure 18A:
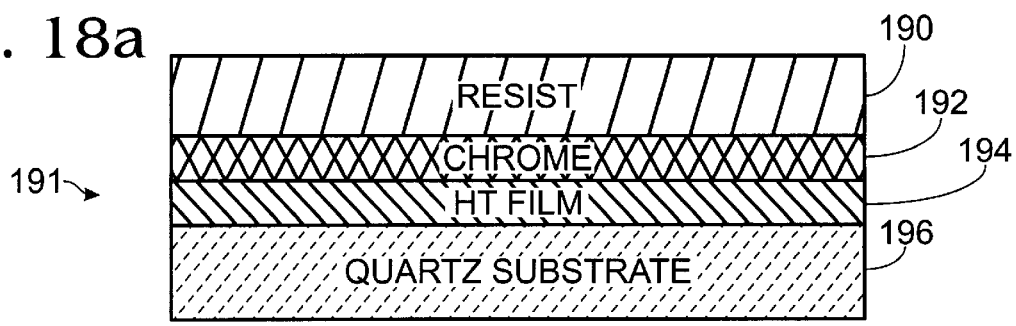
FIGS. 18(a) through 18(e) illustrate an alternate embodiment of the present invention, a method of forming a multi-level reticle from a multi-level photoresist profile.
Figure 18B:
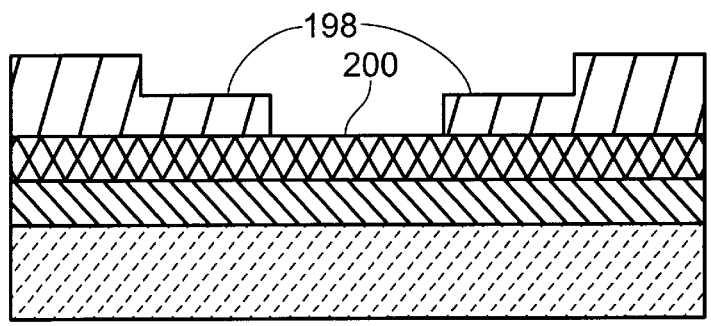
Figure 18C:
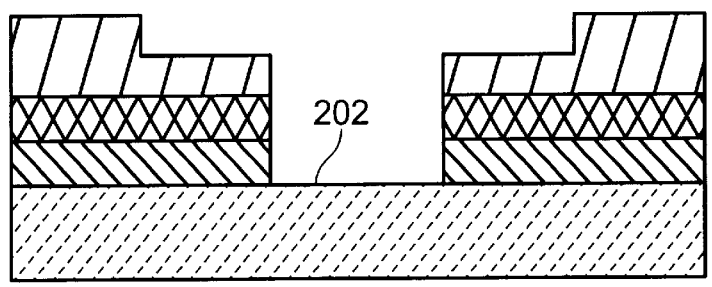
Figure 18D:
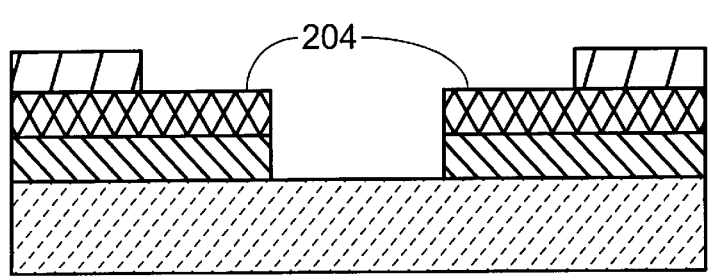
Figure 18E:
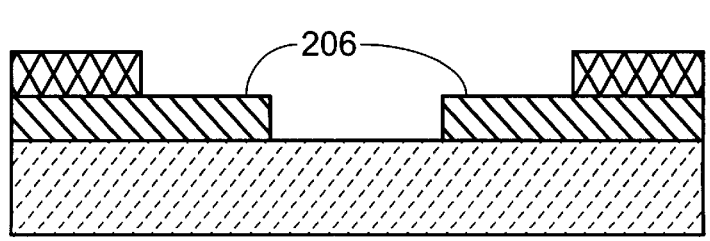

FIG. 17 illustrates the method of the present invention to form a photoresist profile having two exposure patterns from a single reticle. Step 180 provides a substrate for a photoresist profile. Step 182 provides a layer of photoresist having a predetermined thickness on the substrate. Step 184 directs light to the photoresist through a reticle having a first transmitting intensity to create a first exposure pattern, the reticle having a second transmitting intensity to create a second exposure pattern. Step 186 develops the photoresist to remove a first thickness of photoresist, less than the predetermined thickness, in the areas of the first exposure pattern, and to remove a second thickness of the photoresist in the areas of the second exposure pattern. Step 188 is a product, a profile including areas of photoresist having a plurality of different thicknesses.

It is a feature of the invention that step 184 includes directing light to the photoresist through a reticle having a third transmitting intensity to create a third exposure pattern in the photoresist, and wherein step 186 includes removing a third thickness of the photoresist in the areas of the third exposure pattern, whereby the profile includes areas of photoresist having at least three different thicknesses.

In a preferred embodiment step 184 includes exposing the photoresist to light at the first transmitting intensity to create the first exposure pattern, and exposing the photoresist to light at the second transmitting intensity greater than the first transmitting intensity to create the second exposure pattern. In the preferred embodiment the second exposure pattern at least partially overlaps the first exposure pattern. In many typical applications the photoresist will be used to form a via with an overlying connecting line. The via is formed by the hole in the resist, or second exposure pattern. The line is formed at the intermediate level of the resist, or the first exposure pattern. For the via and line to electrically communicate the exposure patterns must overlap.

The explanation of FIG. 17 is supplemented with notice that the light used for the second exposure pattern has a larger dosage of photons per unit area than light used for the first exposure pattern, and step 186 includes developing the photoresist to remove substantially the full predetermined thickness of the photoresist in the areas of the second exposure pattern and to remove only the first thickness, less than the predetermined thickness, in the areas of the first exposure pattern. As explained in FIG. 8, photoresist is removed by a calculation of dosage. Dosage is a measure of light intensity and time over a given area. The same calculation can be performed using photons per unit area.

The explanation of reticles and resist profiles has chiefly focused on the formation of a bi-level resist profile from a tri-level reticle, however, the present invention is not so limited. The methods detailed above are applicable to reticles having more than three levels to form resist profile of more than two levels.

FIGS. 18(*a*) through 18(*e*) illustrate an alternate embodiment of the present invention, a method of forming a multi-level reticle from a multi-level photoresist profile. In FIG. 18(*a*) a photoresist film 190 is formed over a multi-level reticle 191 comprising an opaque, or chrome, layer 192, a partially transmitting, or half tone (HT) film 194, and a quartz substrate 196. In FIG. 18(*b*) the resist is removed to two levels using an electron beam (e-beam). The e-beam removes resist to an intermediate layer 198, and also totally removes resist to expose an area 200 of opaque film 192. In FIG. 18(*c*) reticle 191 is etched so that opaque film 192 and partially transmitting film 194 are removed beneath area 200, to reveal an area 202 of substrate 196. In FIG. 18(*d*) resist 190 is partially removed so that an area 204 of opaque film 192 is revealed. In FIG. 18(*e*) area 204 of opaque film 192 is etched to reveal an area 206 of partially transmitting film 194. In FIG. 18(*e*) the remaining resist 190 is removed. Reticle 191 of FIG. 18(*e*) is the same as reticle 50 of FIG. 5. However, reticle 191 has been formed with only one resist development process. Also, the alignment of features is better than that possible with the reticle of FIG. 5. Since the reticle does that have to be aligned with a second resist pattern, as shown in FIG. 4, alignment accuracies of 0.005 microns, between area 206 and 200 are achieved. Area 206 corresponds, typically, to the line (trench) interconnects in the intermediate interlevel of a dielectric, and area 200 corresponds to vias. The above process describes the formation of a tri-level reticle, but it is not so limited. The same process can also be applied to form three or more levels of resist over reticle 191 to form a reticle 191 having four or more levels. Modifications and variations within the scope of the present invention will occur to those skilled in the art.

What is claimed is:

1. A reticle through which at least three intensities of incident light are passed to define a multi-level profile on a light sensitive photoresist surface, the reticle comprising:

a first transmission level film producing transmitted light of a first intensity;

a second transmission level film producing transmitted light of a second, intermediate, intensity greater than the first intensity, and retarding the phase of the transmitted second intensity of light approximately 90 degrees; and a third transmission level film producing transmitted light of a third intensity greater than the second intensity, whereby the light transmitted through the reticle with the first intensity exposes a first photoresist area to a first dosage, the light transmitted with the second intensity exposes a second photoresist area to a second dosage, and the light transmitted with the third intensity exposes a third photoresist area to a third dosage.

2. The reticle as in claim 1 in which said third transmission level film is a substrate, in which said second transmission level overlies said third transmission level substrate, and in which said first transmission level film overlies said second transmission level film.

3. The reticle as in claim 1 in which said first transmission level film is an opaque film selected from a group consisting of Cr, CrO, and iron oxide, whereby said first transmission level film blocks incident light.

4. The reticle as in claim 1 in which said third transmission level film is selected from a group consisting of quartz, synthetic quartz, and glass, whereby said third transmission level film is transparent to pass all incident light.

5. The reticle as in claim 1 in which said first transmission level film has a first transmission level opening, through said first transmission level film, to reveal a predetermined area of said second transmission level film, and in which said second transmission level area has a second transmission level opening, through said second transmission level, to reveal a predetermined area of said third transmission level film.

6. The reticle as in claim 1 in which a plurality of second transmission level films are provided, each of said plurality of second transmission level films producing transmitted light at one of a plurality of second intensities greater than the first intensity and less than the third intensity, whereby light in a range of second intensities is provided.

7. The reticle as in claim 1 in which said first transmission level film is made up of a plurality of second transmission level films, each one of said plurality of second transmission level films being a partially transmitting film layer such that the intensity characteristics of light transmitted through said plurality of second level films are cumulative to yield the light transmission characteristics of said first transmission level film.

8. The reticle as in claim 7 in which said first transmission level film includes a first number of film layers, that is substantially all of said multiple partially transmitting film layers, and in which said second transmission level film includes a second number of said multiple partially transmitting film layers, fewer than the first number of film layers.

9. The reticle as in claim 1 in which said second transmission level film is selected from the group consisting of indium tin oxide and molybdenum silicon oxynitride, whereby said second transmission level film attenuates the intensity of transmitted light, a predetermined percentage.

10. The reticle as in claim 1 in which said second transmission level film transmits more than approximately 10%, but less than approximately 90%, of incident light, whereby the intensity of light transmitted by said second transmission level film is approximately midway between said first and third transmission level film intensities, such that the reticle, when directed to a light sensitive surface, forms at least three distinct intensities on the illuminated areas of photoresist.

11. A reticle for transmitting at least three intensities of incident light to create a multi-level profile pattern of at least three thicknesses on a light sensitive photoresist film overlying an integrated circuit interlevel dielectric, the reticle comprising:

a partially transmitting film, said partially transmitting film retarding the phase of incident light approximately 90 degrees and intermediately attenuating incident light to form a first thickness of photoresist profile;

an opaque film, said opaque blocking all incident light to form a second thickness of photoresist profile greater than the first thickness of photoresist profile; and a transparent substrate, said substrate passing all incident light to form a third thickness of photoresist profile less than the first thickness of photoresist profile, whereby the attenuation characteristics of said partially transmitting film are approximately midway between said opaque film and said transparent substrate attenuation characteristics.

12. The reticle as in claim 11 in which the third thickness is substantially zero so that an opening is formed in the photoresist film.

13. A reticle for transmitting incident light to create a profile pattern of at least two thicknesses and an opening, on a light sensitive photoresist film overlying an integrated circuit substrate, the reticle having a transparent substrate, passing all incident light, to form an opening in the photoresist profile, the reticle also having an opaque film, blocking all incident light to form a second thickness in the photoresist profile, the reticle comprising:

a partially transmitting film, intermediately attenuating incident light and retarding the phase of incident light approximately 90 degrees, to form a first thickness in the photoresist profile, the first thickness of photoresist profile being approximately ½ the second thickness of photoresist profile, after exposure and development.

14. A reticle as in claim 10 in which said second transmission level film transmits approximately 30% of incident light.

15. A reticle as in claim 11 in which said partially transmitting film transmits more than approximately 10%, but less than approximately 90% of incident light, whereby the attenuation characteristics of said partially transmitting film are approximately midway between said opaque film and said transparent substrate attenuation characteristics, such that the reticle, when directed to the light sensitive surface, forms at least three distinct intensities on the illuminated areas of photoresist.

16. A reticle as in claim 15 in which said partially transmitting film transmits approximately 30% of incident light.

17. A reticle as in claim 13 in which said partially transmitting film transmits more than approximately 10%, but less than approximately 90% of incident light, whereby the attenuation characteristics of said partially transmitting film are approximately midway between the opaque film and the transparent substrate attenuation characteristics, such that the reticle, when directed to the light sensitive surface, forms at least three distinct intensities on the illuminated areas of photoresist.

18. A reticle as in claim 17 in which said partially transmitting film transmits approximately 30% of incident light.

19. A photolithographic reticle to form a dual damascene profile in a photoresist film having a first thickness, the dual damascene profile having a via at a third thickness of zero and trench at a second thickness, intermediate between the first and third thicknesses, from a single exposure to a light source, the reticle comprising:

a partially transmitting film, said partially transmitting film retarding the phase of incident light approximately 90 degrees and intermediately attenuating incident light to form the second thickness in the photoresist profile;

an opaque film, said opaque blocking all incident light to form the first thickness in the photoresist profile; and a transparent substrate, said substrate passing all incident light to form the third thickness of photoresist profile, whereby the attenuation characteristics of said partially transmitting film are approximately midway between said opaque film and said transparent substrate attenuation characteristics.

20. A reticle as in claim 19 in which said partially transmitting film transmits more than approximately 10%, but less than approximately 90% of incident light, whereby the reticle, when directed to the light sensitive surface, forms at least three distinct intensities on the illuminated areas of photoresist.

21. A reticle as in claim 19 in which said partially transmitting film transmits approximately 30% of incident light.

\* \* \* \* \*